United States Patent
Haque et al.

(10) Patent No.: US 7,970,215 B2
(45) Date of Patent: Jun. 28, 2011

(54) AUTOMATIC GENERATION OF COMPACT CODE TABLES

(75) Inventors: Munsi A. Haque, San Jose, CA (US); Musa Jahanghir, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 1124 days.

(21) Appl. No.: 11/694,785

(22) Filed: Mar. 30, 2007

(65) Prior Publication Data

US 2008/0240596 A1  Oct. 2, 2008

(51) Int. Cl.
G06K 9/36 (2006.01)

(52) U.S. Cl. .................................... 382/232; 382/246

(58) Field of Classification Search .................. 382/232, 382/233, 246, 251; 341/96, 106, 107
See application file for complete search history.

(56) References Cited

U.S. PATENT DOCUMENTS

| | | | |
|---|---|---|---|
| 6,141,457 A * | 10/2000 | Jahanghir et al. | 382/250 |
| 6,275,616 B1 * | 8/2001 | Jahanghir et al. | 382/233 |
| 6,646,579 B2 * | 11/2003 | Doetsch et al. | 341/96 |
| 7,129,864 B2 | 10/2006 | Jahanghir et al. | |
| 7,262,722 B1 | 8/2007 | Jahanghir et al. | |
| 2003/0105532 A1 * | 6/2003 | Doetsch et al. | 700/1 |
| 2006/0294174 A1 | 12/2006 | Haque et al. | |

OTHER PUBLICATIONS

First Office Action Mailed Feb. 26, 2010, Chinese Patent Application No. 200810100362.2.

* cited by examiner

Primary Examiner — Duy M Dang
(74) Attorney, Agent, or Firm — Kacvinsky Daisak PLLC (57) ABSTRACT

An apparatus includes a compact table generator module and a storage medium. The compact table generator creates a compact code table having multiple code word groups arranged in one or more hierarchies. Each of these code word groups includes a group mask that corresponds to one or more code words in a variable length code table. The storage medium stores information regarding the code word groups, such as a group mask for each of the code word groups, and a code index for each code word in the variable length code table.

16 Claims, 10 Drawing Sheets

AUTOMATIC GENERATION OF COMPACT CODE TABLES

BACKGROUND

Electronic data, including text, graphics, voice, multimedia, and other strings of symbols, may be represented by binary codes that compress such information. Such compression reduces the number of bits required for storing and/or transmitting the data. Binary codes of different or variable lengths may be used to represent different symbols in a bitstream of data. According to some binary code compression techniques, more frequently occurring symbols within a bitstream are represented with shorter codes, and less frequently occurring codes are represented using longer codes. Such a scheme may be referred to as Variable Length Coding (VLC).

One type of VLC scheme may involve Huffman codes. Huffman codes may be used, for example, in digital video compression and information retrieval for video coding standards such as Microsoft™ Windows Media, MPEG-2, MPEG-4, H.263, H.264, and other such standards employing VLC.

Huffman codes employ variable length code words. Thus, in some Huffman decoding implementations, a bitstream segment of the incoming bitstream may be matched against the contents of a Look-Up-Table (LUT) according to a "nibble-by-nibble" approach. For example, a decoder may look into a first, fixed size nibble and try to match it with first table entries in a Huffman decoding table. If no match is found, the decoder may look into a second, fixed size nibble and try to match with second table entries, and so forth. Such an approach may be conceptualized as a hashing function.

For longer Huffman code words (e.g., 23 bit code words), however, such nibbling schemes may take up to 6 steps and/or clocks to match the longest Huffman codewords. Longer code words, in such a nibbling scheme, may limit decoding throughput.

To reduce such throughput limitations, tables of Huffman code words may be remapped into compact tables. Such compact tables may provide for decoding through the detection of run lengths of a particular binary value (e.g., 0 or 1). Run length detection may be performed more rapidly than nibble-by-nibble approaches. Such detection may be implemented with dedicated hardware logic, software (e.g., a leading zero detector (LZD)), or combinations thereof. Moreover, longer runs of binary values may facilitate rapid detection, by dedicated hardware logic or a software detector (e.g., a leading zero detector (LZD)) or some combination thereof.

Generation of compact tables may be performed manually. However, such techniques are laborious and prone to creating table errors.

DETAILED DESCRIPTION

Various embodiments may be generally directed to generation and use of codes. In one embodiment, for example, an apparatus includes a compact table generator module and a storage medium. The compact table generator creates a compact code table having multiple code word groups arranged in one or more hierarchies. Each of these code word groups includes a group mask that corresponds to one or more code words in a variable length code table. The storage medium stores information regarding the code word groups, such as a group mask for each of the code word groups, and a code index for each code word in the variable length code table. Such creation and storage of compact code tables may be performed automatically.

In this manner, fast and efficient decoding may be achieved. Also, more efficient storage of code tables may be attained. Other embodiments may be described and claimed.

Various embodiments may comprise one or more elements. An element may comprise any structure arranged to perform certain operations. Each element may be implemented as hardware, software, or combinations thereof, as desired for a given set of design parameters or performance constraints. Although an embodiment may be described with a limited number of elements in a certain topology by way of example, the embodiment may include greater or fewer elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Figure 1:
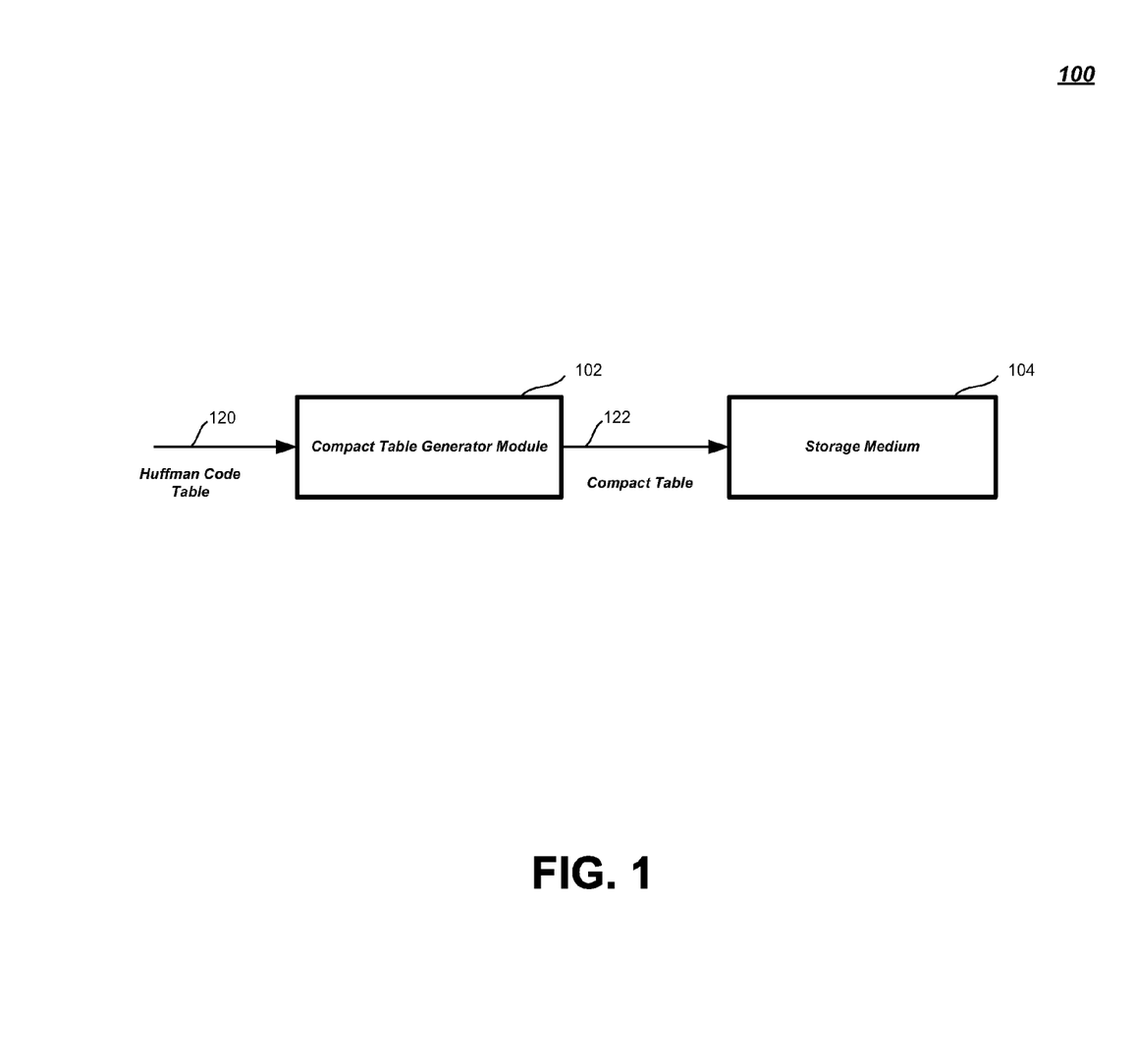
FIG. 1 illustrates one embodiment of an apparatus, which may be used to generate compact tables.

FIG. 1 is a block diagram of an apparatus 100, which may be used to generate compact tables from Huffman tables. As shown in FIG. 1, apparatus 100 may include various elements. For instance, apparatus 100 may include a compact table generator module 102, and a storage medium 104. These elements may be implemented in hardware, software, firmware, or in any combination thereof.

Apparatus 100 may map Huffman code tables one-by-one so that each Huffman code table with it's many changing ones and zeroes in a long branch are smoothed out to all zeroes or all ones. Such smoothing allows for fast decoding, for example, by run length decoder hardware.

As shown in FIG. 1 compact table generator module 102 receives a Huffman code table 120 and generates a corresponding compact table 122, which may be sent to storage medium 104. Compact table 122 may be used in various operations, such as encoding and decoding information sequences.

Operations for embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 2:
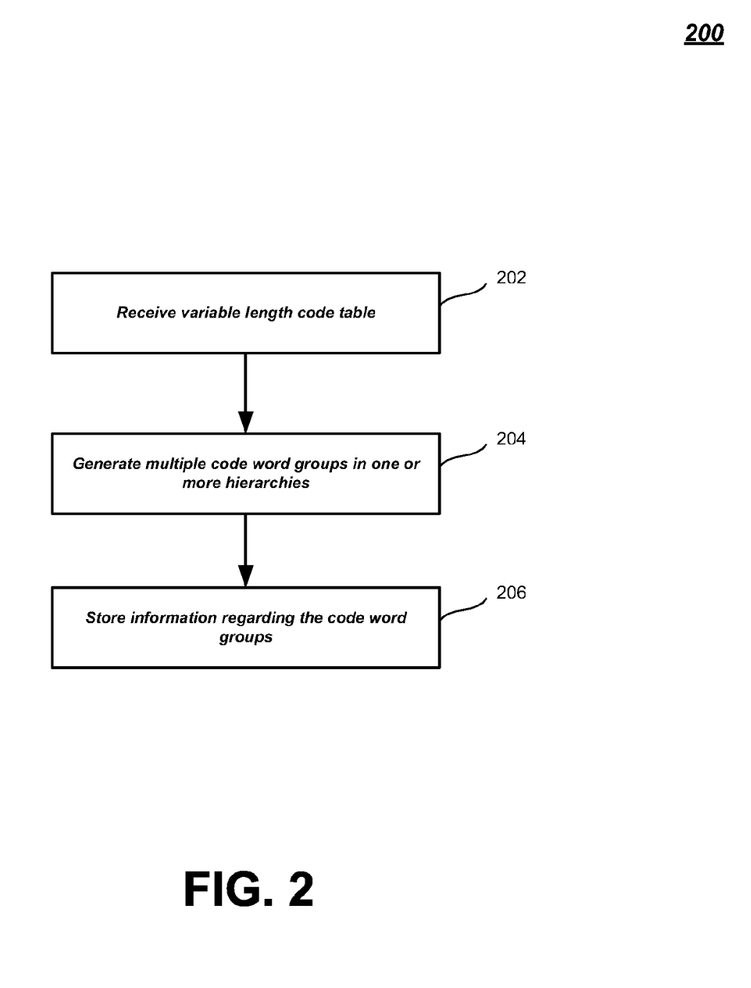
FIG. 2 illustrates one embodiment of a component.

FIG. 2 is a diagram of a logic flow 200 that embodiments, such as apparatus 100, may perform in the generation of compact tables from variable length code tables.

As shown in FIG. 2, a block 202 receives a variable length code table, such as a Huffman table. From this received code table, one or more code word groups are generated by a block 204. These groups are arranged in one or more hierarchies. For instance, a hierarchy may be arranged as a tree structure comprising a top level group and one or more subgroups. In such arrangements, the top level group and subgroups may each have one or more subgroups.

In generating each code word group, block 204 may further generate corresponding information. For example, block 204 may generate a group mask for each code word group. Group masks may be employed in the determining whether to generate further code word sub groups.

In addition to being employed in the generation of compact tables, group masks may further be employed in decoding operations.

A block 206 stores information regarding the code word groups. This information may include the group mask for each group as well as the code indices corresponding to each group. The embodiments, however, are not limited to these examples.

Figure 3:
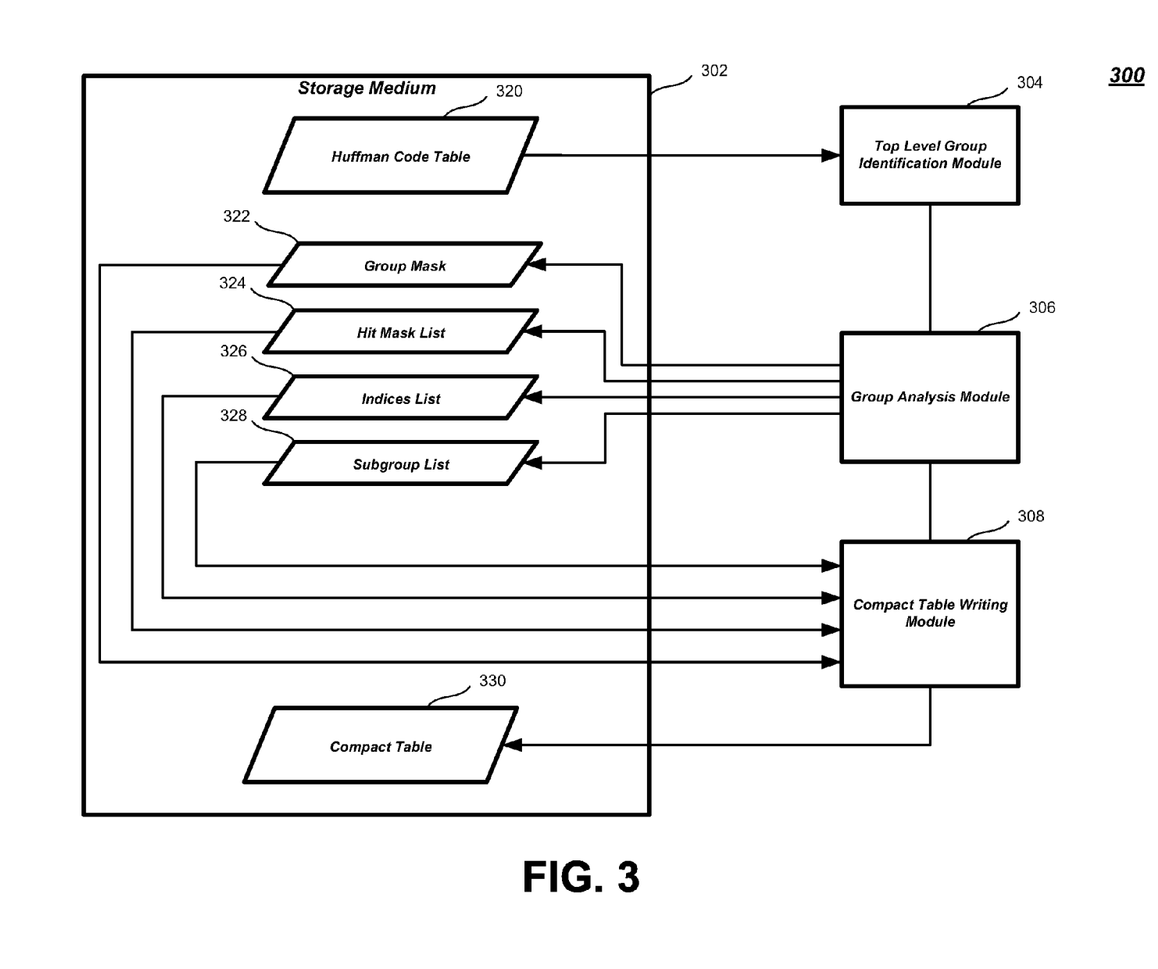
FIG. 3 illustrates one embodiment of a logic diagram.

FIG. 3 is a block diagram showing an exemplary implementation 300 of code generator module 102. As shown in FIG. 3, implementation 300 may include various elements. For instance, FIG. 3 shows that implementation 300 may include a storage medium 302, a top level group identification module 304, a group analysis module 306, and a table writing module 308. These elements may be implemented in hardware, software, firmware, or in any combination thereof.

Storage medium 302 stores various information used in the generation of compact tables. For instance, storage medium 302 may store one or more Huffman code tables 320. In addition, storage medium 302 may store one or more corresponding compact tables 330. Storage medium 302 may also store various forms of information during compact table generation. For instance, FIG. 3 shows storage medium storing a group mask 322, a hit mask list 324, an indices list 326, and a subgroup list 328.

Top level group identification module 304 identifies initial top-level groups of code words within a Huffman code table 320.

Group analysis module 306 analyzes of one or more code word groups. This analysis may identify further subgroups that correspond to particular groups. In addition, this analysis may involve the generation of information. Such information may include masks, hit mask lists, and/or lists of indices.

Compact table writing module 308 formats and outputs table entries according to processing performed by group analysis module.

Figure 4A:
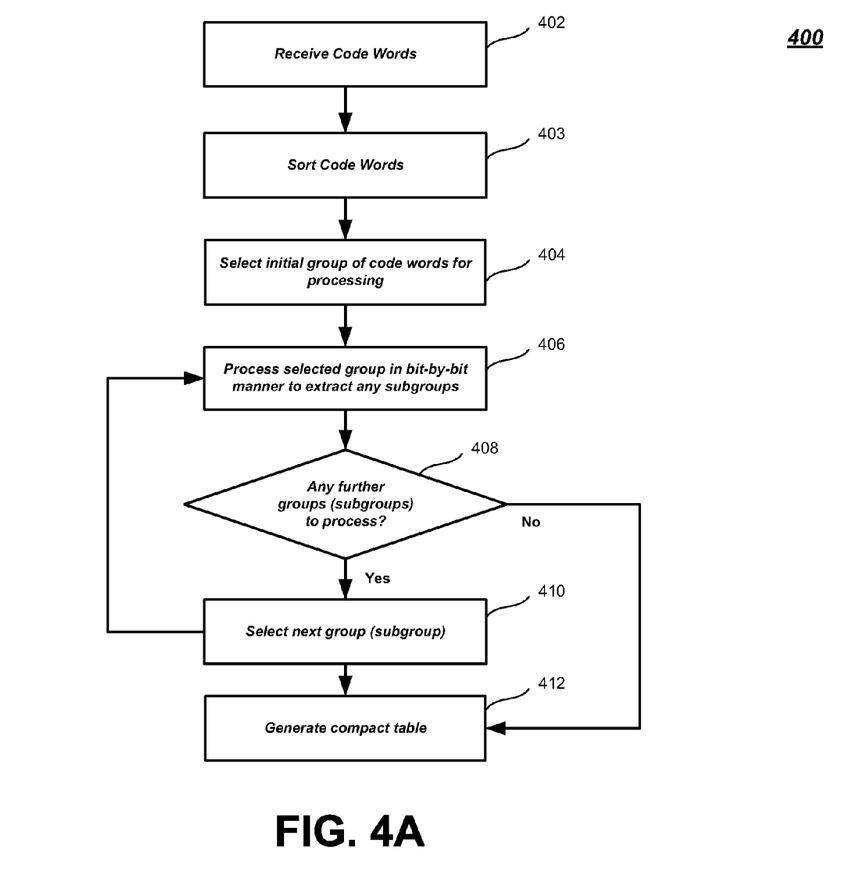
FIGS. 4A and 4B illustrate embodiments of logic diagrams.

FIG. 4A is a diagram of a logic flow that embodiments, such as apparatus 100 and/or implementation 300, may perform in the generation of compact tables from variable length code tables.

As shown in FIG. 4A, a block 402 receives a Huffman code table, which includes multiple code words having various lengths. The code words in the Huffman code table are sorted by a block 403. A weight scheme may be employed to perform this sorting, as the code words have various lengths. An exemplary weight scheme assigns blank spaces a minimum weight, the bit value '1' an intermediate weight, and the bit value '0' a maximum weight. Tables 1-1 and 1-2, below, provide an example of such sorting. In particular, Table 1-1 shows unsorted Huffman code words, and Table 1-2 shows these code words sorted.

TABLE 1-1

Unsorted Values & Code Words

| Value | Code Word |
|---|---|
| 1 | 0110 |
| 2 | 1011 |
| 3 | 101 |
| 4 | 001 |
| 5 | 01 |

TABLE 1-2

Sorted Values & Code Words

| Value | Code Word |
|---|---|
| 5 | 01 |
| 3 | 101 |
| 4 | 001 |
| 2 | 1011 |
| 1 | 0110 |

FIG. 4A shows that, at a block 404, an initial group of code words may be selected for processing. This selected group (referred to herein as the current group) may comprise, for example, the entire table of code words. Alternatively, this initial group may comprise a portion of the entire table. Such portions may include, for instance, multiple code words having the same prefix or initial set of one or more bits (e.g., the same 4-bit prefix).

This initial is assigned an initial serial index (e.g., an index of zero). Thus, this initial group may be referred to herein as "Group 0."

At a block 406, the group is processed in a bit-by-bit manner to extract one or more subgroups (if any). Such extracted subgroups are given serial indices in the order they are extracted. Further details regarding an exemplary processing of a group is described below with reference to FIG. 4B.

The flow further includes a block 408, which determines whether there are any further groups (subgroups) to process. If so a block 410 selects a next subgroup for processing. Otherwise, the flow proceeds to a block 412.

At block 410, the next subgroup may be selected according to a next increasing serial index. Thus, if Group 0 was most recently processed at block 406, then block 410 would select Subgroup 1.

Upon this selection, operation returns to block 406 for processing of the selected subgroup. Thus, this processing may extract further subgroups which will also be assigned serial indices in the order they are extracted. Accordingly, as provided by block 408, this flow is iterative and continues until there are no more subgroups to process. Once there are no more subgroups to process, FIG. 4A shows that a block 412 generates a compact table based on the processing performed at blocks 406 and 410.

Thus, as indicated by block 406, each particular group of code words may be processed sequentially. An example of such processing is now described with reference to a logic flow 400 of FIG. 4B. This flow may be performed by embodiments, such as apparatus 100 and/or implementation 300.

Figure 4B:
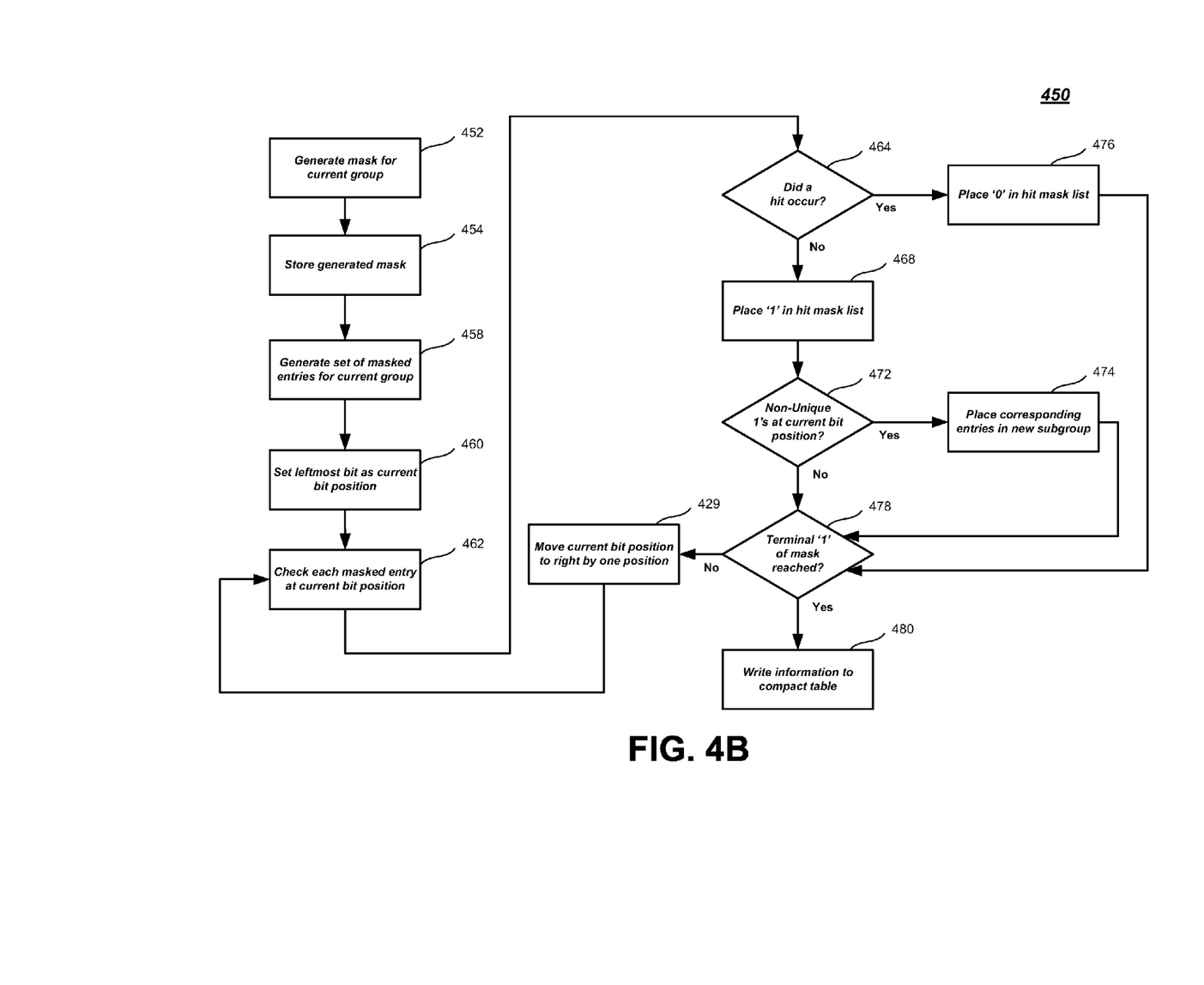

FIG. 4B shows that, at a block 452, a mask is generated for a current group. With reference to FIG. 4A, the current group is the group most recently selected by either block 404 or block 410. Generation of this mask may comprise identifying a longest code-word in the current group and padding its right side (or its least significant side) with a '1'. Sometimes, a current group may have more than one longest code word.

When this occurs, a particular code word (e.g., the last codeword in the sorted subgroup) may be selected. As shown in FIG. 4B, the generated mask is stored at a block 454.

A set of masked entries is generated at a block 458. Generation of this set may involve performing an exclusive-OR (XOR) operation with each table entry in the current group and the mask generated at block 452. For these XOR operations, the leftmost bits of the table entries are aligned with the leftmost bit of the mask.

As described below, these masked entries will be processed to generate a hit mask list (or "Hit_Mask_List") for the current group. The hit mask list is a binary number written one bit at a time from right to left. This list identifies the location of non-unique 1's. Therefore, the hit mask list may employed during compact table generation and/or decoding operations to determine whether a run length of a given symbol (e.g., zero or more '0s') identifies a value in a current group, or whether the decoding must continue in a sub-group.

At a block 460 the leftmost bit position is selected as a current bit position. Upon this selection, a block 462, checks each of the masked entries at the current bit position. If the checked bits at a particular bit location of the masked result yield a "Unique 1", then this location is considered a "HIT". Otherwise, this location is considered a "MISS". A Unique 1 occurs when a masked entry has a '1' at the particular bit location and no other masked entries of the same size or greater have a '1' at this location.

Thus, as indicated by a block 464, operation proceeds to a block 466 when a HIT occurs. Otherwise, operation proceeds to a block 468 when a MISS occurs.

At block 466, a '0' (indicating a hit) is placed in the Hit_Mask_List of the Compact Table. Also, the index (e.g., table entry number) of the masked entry having the Unique 1 is placed in a temporary Index_List.

In contrast, at block 468, a '1' (indicating a miss) is placed in the Hit_Mask_List of the Compact Table.

FIG. 4B shows that a block 472 follows block 468. At this block, it is determined whether the masked entries have any non-unique 1's at the current bit position. If so, then these entries will be put in a new subgroup, as indicated by a block 474. Accordingly, block 474 may create such a new subgroup.

As shown in FIG. 4B, it is determined at a block 478 whether the current bit position has reached the terminal '1' of the mask (which signifies that all entries of the selected group are exhausted). If so, then the current bit position is moved to the right by one position at a block 479. Following this, operation returns to block 462.

However, if the current bit position has reached the terminal '1' of the mask, operation proceeds to a block 480. At this block 480, information is written to the compact table at its next available location(s). Such information may include the hit mask list and the temporary index list for this subgroup.

Referring again to FIG. 4A, it may be determined following this flow (at block 408) whether any new subgroups (if any) have not yet been considered. As described above, such new subgroups may be created at block 474 of FIG. 4B. If any such subgroups currently exist, then block 410 of FIG. 4A may select one of these subgroups as the current group. Upon this selection, block 406 of FIG. 4A may process the selected subgroup. Thus, the flow of FIG. 4B may occur again.

As described above, the flow of FIG. 4B involves the processing of groups, as well as the identification of subgroups. An example of such processing and identification is now provided. This example involves an exemplary Group 0, which Table 2-1 lists below in an unsorted order.

TABLE 2-1

| Unsorted Group 0 | |
|---|---|
| Index | Code Word |
| 0: | 0 1 |
| 1: | 1 0 1 |
| 2: | 0 0 0 |
| 3: | 1 1 |
| 4: | 0 0 1 0 |
| 5: | 1 0 0 |
| 6: | 0 0 1 1 |

This group is sorted, as indicated below in Table 2-2. Also a group mask of 00100 is generated for Group 0. As described above, this mask is generated from the codeword at the end of the sorted group (0010).

As described above, a masking operation is performed for each codeword Group 0. The third column of Table 2-2 further provides the results of these masking operations.

TABLE 2-2

| Sorted Group 0 | | |
|---|---|---|
| Index | Codeword | Masked Code Word |
| 3: | 1 1 | 1 1 |
| 1: | 1 0 1 | 1 0 0 |
| 5: | 1 0 0 | 1 0 1 |
| 0: | 0 1 | 0 1 |
| 2: | 0 0 0 | 0 0 1 |
| 6: | 0 0 1 1 | 0 0 0 1 |
| 4: | 0 0 1 0 | 0 0 0 0 |

Upon performance of this masking operation, each bit position of the masked code words may be analyzed to identify code words for placement in subgroups, as well as to identify code words to retain in the current group. The following description provides an exemplary analysis for each bit position.

Regarding the leftmost bit position, the third column of Table 2-2 indicates that the masked code words for indices 1, 3, and 5 are misses because they each have a 1 at this position. These multiple 1s signify the occurrence of non-unique 1s at this position. Therefore, a new subgroup (referred to as Group 1) is created for indices 1, 3, and 5. Also, since a miss occurs at this position, the rightmost bit of the hit mask list is assigned a 1. Thus, upon processing of the leftmost bit position, the current groupings and hit mask list are as follows.

| | |
|---|---|
| Group 0: | indices 0, 2, 4, 6 |
| Group 1: | indices 1, 3, 5 |
| Hit_Mask_List: | 1 |

At the second bit position from the left, a unique 1 occurs. In particular, only the masked codeword for index 0 has a 1 at this position. Accordingly, no new subgroups are created, and the corresponding hit mask list position is assigned a 0. The results upon processing this bit position are summarized as follows.

| | |
|---|---|
| Group 0: | indices 0, 2, 4, 6 |
| Group 1: | indices 1, 3, 5 |
| Hit_Mask_List: | 01 |

A unique 1 also occurs at the third bit position from the left. Specifically, only the masked codeword for index 2 has a 1 at this position. Accordingly, the processing of this position yields the following results.

| | |
|---|---|
| Group 0: | indices 0, 2, 4, 6 |
| Group 1: | indices 1, 3, 5 |
| Hit_Mask_List: | 001 |

At the fourth bit position from the left, a unique 1 occurs as only the masked code word for index 5 has a 1. Thus, the following groupings and hit mask list exist after processing this bit position.

| | |
|---|---|
| Group 0: | indices 0, 2, 4, 6 |
| Group 1: | indices 1, 3, 5 |
| Hit_Mask_List: | 0001 |

When the final (rightmost) mask bit is reached, no masked code words have bits at this position. The hit mask list is assigned a 0 for this location and the current groupings do not change. Thus, upon completion of Group 0, the following results exist.

| | |
|---|---|
| Group 0: | indices 0, 2, 4, 6 |
| Group 1: | indices 1, 3, 5 |
| Hit_Mask_List: | 00001 |

At this point, processing of Group 1 may occur. This group, in unsorted order, is listed in Table 2-3.

TABLE 2-3

Unsorted Group 1

| Index | Code Word |
|---|---|
| 1: | 1 0 1 |
| 3: | 1 1 |
| 5: | 1 0 0 |

Group 1 is sorted in the order shown in Table 2-4. From this sorting, a group mask of 1001 is generated for Group 1. As described above, this mask is based on the codeword at the end of the sorted group (100). As with Group 0, a masking operation is performed for each codeword Group 1. The third column of Table 2-4 provides the results of these masking operations.

TABLE 2-4

Sorted Group 1

| Index | Code Word | Masked Code Word |
|---|---|---|
| 3: | 1 1 | 0 1 |
| 1: | 1 0 1 | 0 0 1 |
| 5: | 1 0 0 | 0 0 0 |

Upon completion of the masking operation, each bit position of the masked code words may be analyzed. For instance, the third column of Table 2-2 indicates that the masked code words are all misses at the leftmost bit position, as the masked code words of indices 1, 3, and 5 each have a zero bit at this position. Also, no new subgroups are created at this point, because there are no non-Unique 1's at this position. Accordingly, the hit mask list for Group 1 is currently set as shown below.

Hit_Mask_List: 1

At the second bit position from left, Table 2-4 shows that a hit occurs. This is because a Unique 1 exists at this position for the masked code word corresponding to index 3. Thus, the hit mask list for Group 1 is updated in the following manner.

Hit_Mask_List: 01

A Hit also occurs at the third bit position from left, because a Unique 1 exists at this position for the code word corresponding to index 1.

$Hit_{13}$ Mask_List: 001

When the final (rightmost) mask bit is reached, no masked code words have bits at this position. Thus, as described above, the hit mask list is assigned a 0 for this location and the current groupings do not change. Thus, upon completion of Group 1, no new subgroups are created and Group 1 has the following hit mask list.

Hit_Mask_List: 0001

Thus, the above example generated the following hit mask lists from the code words listed in Table 2-1.

Group 0: 00001

Group 1: 0001

Accordingly, once all of the groups (Groups 0 and 1) have been identified and processed, a compact table may be generated.

In embodiments, a predetermined number of initial bits of all Huffman code-words in a Huffman code table are used as top level branches for initial groups. An exemplary number of initial bits is four (i.e., the first nibble of the Huffman code words). Thus, when the initial 4-bit nibble is employed, sixteen (i.e., $2^4$) top level groups exist. Each of these groups are processed, for example, as described above with reference to FIGS. 2 and 4. As indicated above, such processing may reveal further subgroups.

Embodiments may further provide protection against illegal codes. Huffman code tables used for the encoding and decoding of standard bitstreams are sometimes incomplete ("illegal"). For instance, some code-words may be missing from such tables, as these are not needed for encoding purposes. Such unused code-word or holes left in code tables may lead to bitstream errors upon decoding.

Set partitioning may be used in the generation of compact tables to detect and fix the holes of unused code words. Such fixing may also performed for conventional Huffman decoders by filling up the Huffman code tables with unused code-words.

Figure 5:
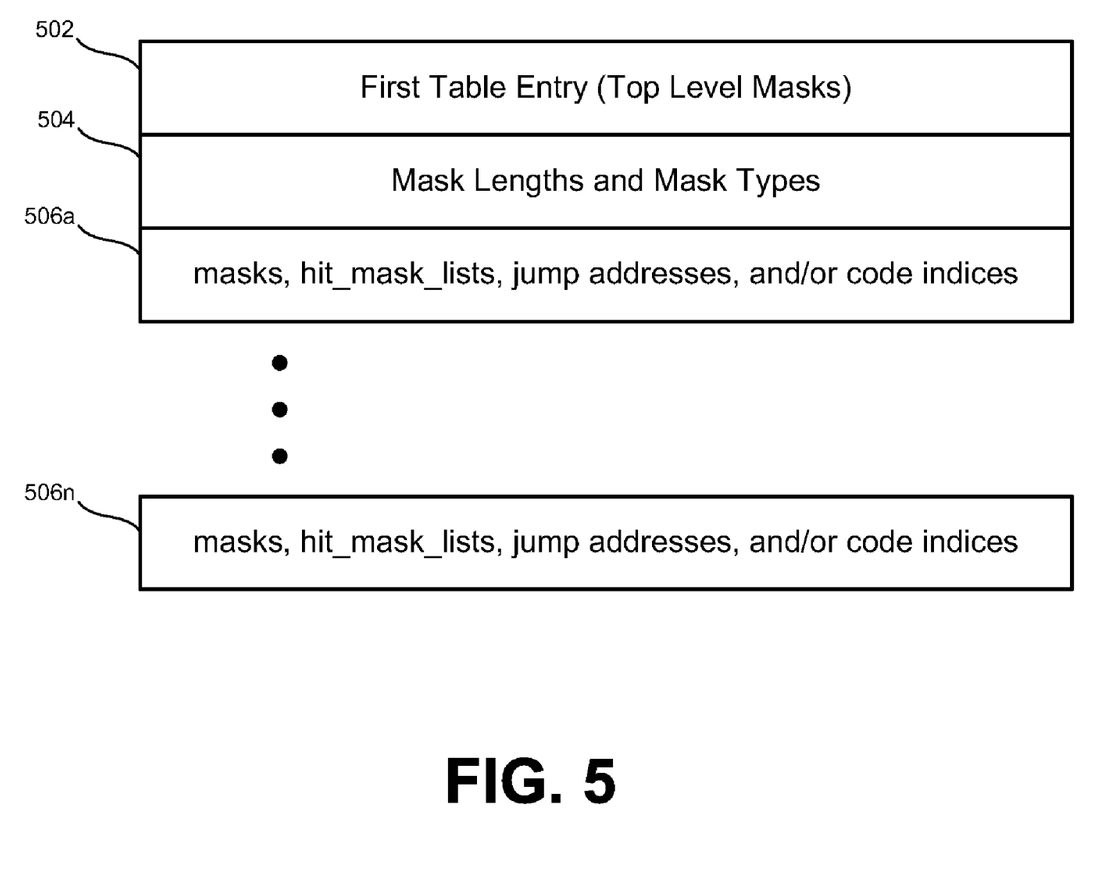
FIG. 5 is a diagram of an exemplary compact table arrangement.

FIG. 5 is a diagram representing an arrangement of a compact table 500 for a Huffman code table. As shown in FIG. 5, a first table entry 502 may contain a mask for each of the top level "tree" branches. As described above, these top level branches or groups may be determined by using a particular number of initial bits of all Huffman code-words in the Huffman code table. In embodiments this predetermined number of initial bits may be the first 4-bit nibble of all Huffman code-words in the Huffman code table. Thus, in such embodiments first table entry 502 comprises sixteen (i.e., $2^4$) masks for sixteen top-level groups.

A next table entry 504 includes lengths for each of the top level code-words/masks. Also, table entry 504 may include a mask type for each of these code-words/masks.

FIG. 5 shows compact table 500 having multiple successive table entries 506. These entries may contain different combinations of masks, hit mask lists, jump addresses, and original code-table indices.

During decoding operations, logical operations (e.g., XOR operations) are performed between input (coded) values and masks that are stored in entries 506. The result of these operations may provide an offset to other entries 506. In turn, these other entries may contain a code index, a jump address, and/or a further mask.

Based on the content of such other entries, traversal of the compact table may continue (e.g., through logical operations with masks, accessing resulting offsets, and/or jumping to other addresses). Traversal may conclude until the arrival of code index in an entry 506. At this point, a new traversal may begin based on further input (coded) data.

Thus, together, the entries of compact table 500 form multi-layered and multi-linked data structures with a very accurate ordering in place among themselves. For instance, these data structures may follow the recursive tree-branch-leaf type structures of Huffman code-tables or fractal-type structures.

In embodiments, super compact tables may be created that correspond to multiple code tables. The embodiments, however, are not limited to this context.

Figure 6A:
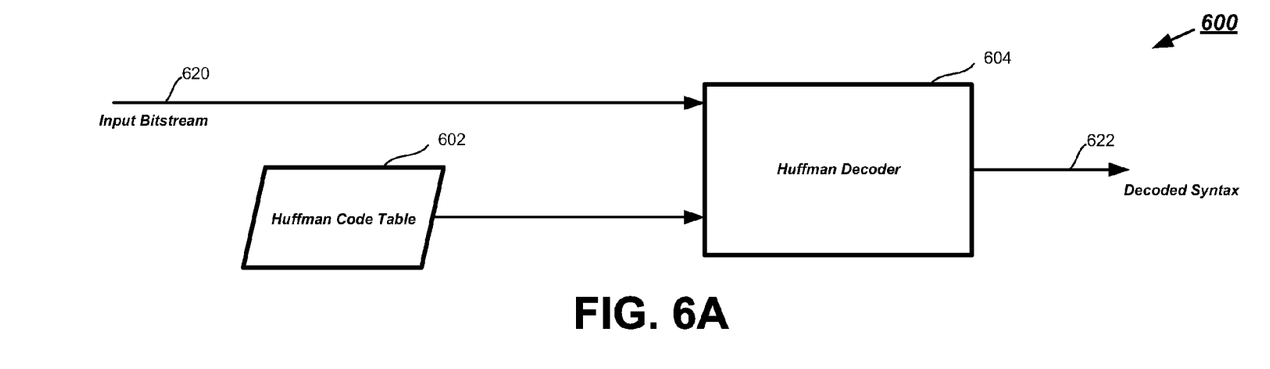
FIGS. 6A-6C illustrate various embodiments.
Figure 6B:
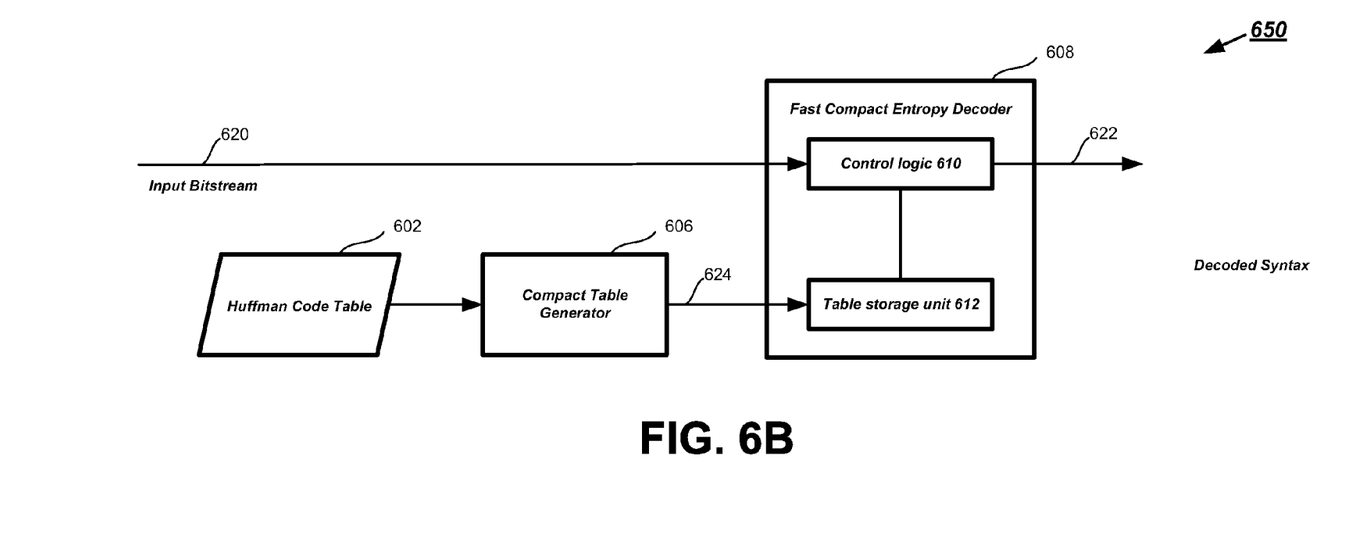

FIGS. 6A and 6B are diagrams of decoding implementations. In particular, FIG. 6A shows a conventional Huffman decoding implementation 600. In contrast, FIG. 6B shows a Huffman decoding implementation 650, which employs compact tables.

As shown in FIG. 6A, implementation 600 includes a Huffman code table 602 and a Huffman decoder 604. Upon receipt of an encoded input bit stream 620, Huffman decoder 604 decodes the bit stream and outputs a decoded syntax 622.

FIG. 6B shows that implementation 650 also generates decoded syntax 622 from input bit stream 620. However, instead of employing a conventional Huffman decoder, implementation 650 employs a fast compact entropy decoder 608 to efficiently decode bit stream 620. In particular, decoder 608 performs this efficient decoding by using a compact table 624 that is generated by a compact table generator 606. Compact table 624 may be generated according to the techniques described herein. Thus, compact table generator 606 may include, for example, the arrangements of FIG. 1 and/or FIG. 3.

As shown in FIG. 6B, decoder 608 includes control logic 610 and table storage unit 612. Control logic 610 may perform Control logic 610 may be implemented in hardware, software, firmware, or any combination thereof. Table storage unit 612 may be implemented with a storage medium, such as memory.

FIG. 6B shows that table storage unit 612 stores compact table 624. Control logic 610 may access this table from table storage unit 612 and perform various operations. These operations may include logical, such as XOR operations between received bit sequences and masks contained in compact table 624. Moreover, such operations may include the identification of preambles (e.g., the first four bits in a code word) for group identification, and the calculation of addresses within compact table. Such calculations may be based, for example, on jump addresses contained in compact table 624. Moreover, control logic may analyze results of such operations, as well as generate decoded syntax 622 based on such operations and analysis. Examples of features are provided with reference to FIG. 7.

In embodiments, compact tables may advantageously be used to provide encryption and watermarking features. For instance, a set of replaceable Huffman code tables may be created in place of a given standard Huffman code table. The process of creating such replacement tables can follow any given process involved in a given encryption or watermarking process. As examples, such replacement tables may be new tables similar to the given standard table, or by reordering some leaves of the code-words having the same code-length, or inserting the unused (or Illegal) codes in the code-tables at a so-called arbitrary position (watermarking), and so on. During the encoding process, a given standard table can be replaced with a replacement table according to a pre-set encryption or watermarking rule and thus an encrypted or watermarked bitstream is generated.

Such encryption/watermarking rules may be sent to a fast compact decoder (e.g., before decoding of such encrypted/watermarked bitstreams. These rules may be sent across other communications media or other transport layers (e.g., as private user data). Accordingly, upon receipt, the fast compact decoder may use such rules to rearrange the compact table(s) for decoding. Such rearranging may involve shuffling (or moving) code indices among their current positions in a compact table.

Figure 6C:
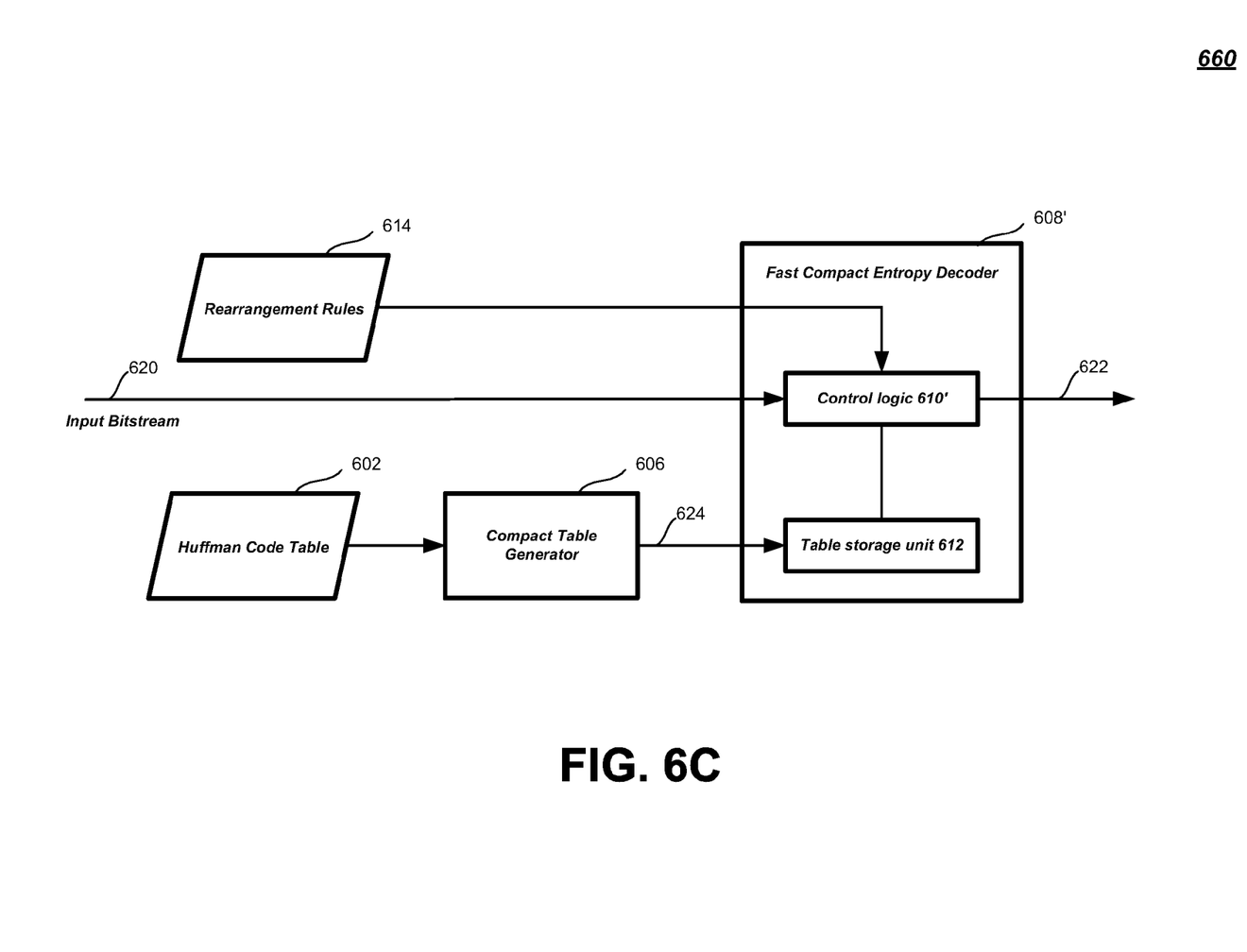

Accordingly, FIG. 6C illustrates a decoding implementation 660, which provides an example of such features. The implementation of FIG. 6C is similar to the one of FIG. 6B. However, in FIG. 6B, the decoder 608 is replaced with a decoder 608'. As shown in FIG. 6B, decoder 608' includes control logic 610'. Control logic 610' may perform the operations of control logic 610. However, control logic 610' may further rearrange compact table 624 according to the encryption/watermarking techniques described herein.

FIG. 6C shows control logic 610' receiving rearrangement rules 614. As described above, these rules may be over communications media or transport layers that are not employed to receive input bitstream 620. Upon receipt of rules 614, control logic 610' may rearrange compact table 624 within table storage unit 612. As described above, such rearrangement may involve shuffling code indices.

Figure 7:
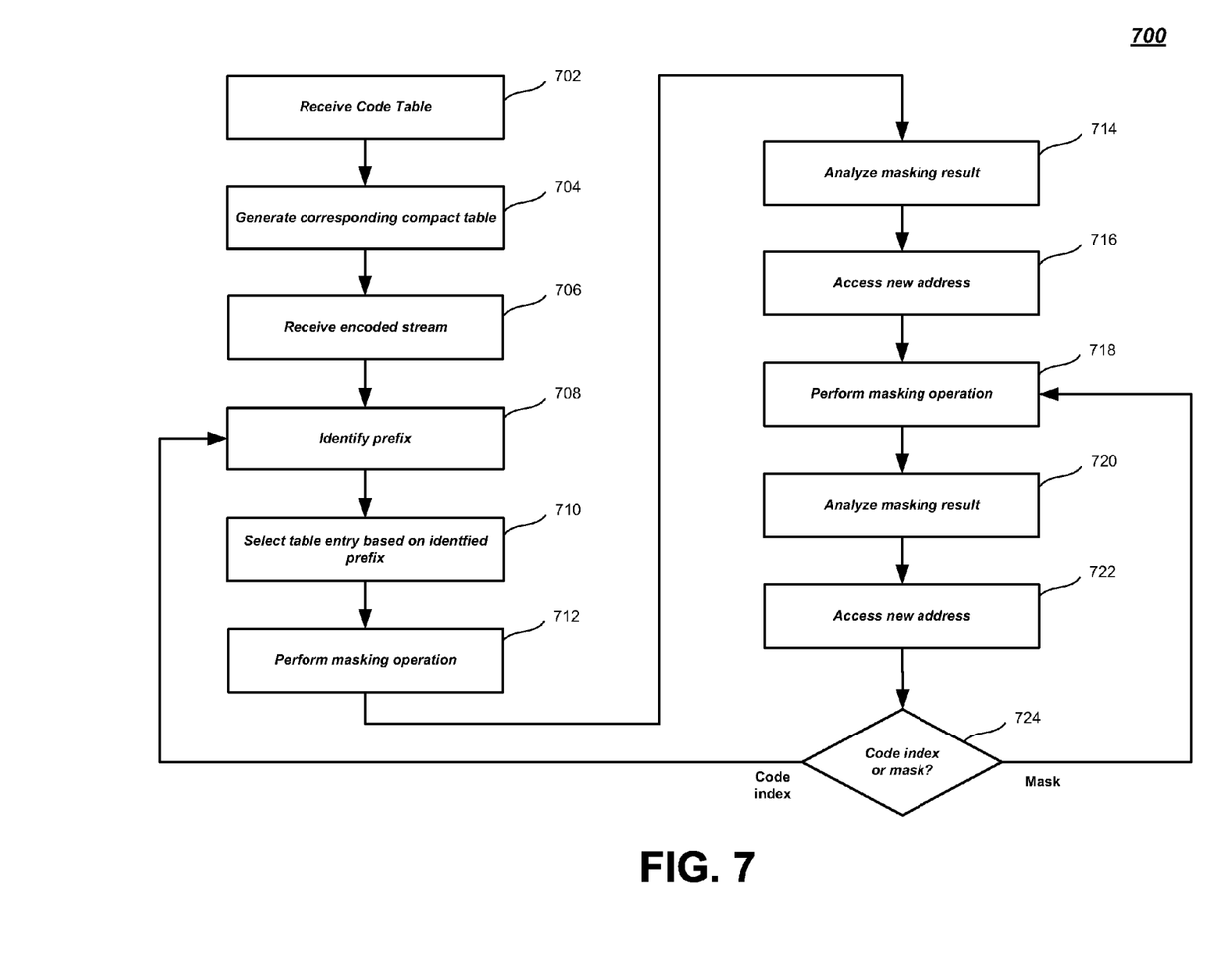
FIG. 7 is an exemplary logic flow embodiment.

FIG. 7 is a diagram of a logic flow 700 that may be employed in the decoding of variable length encoded, such as Huffman encoded information (e.g., bit streams). For example, this logic flow may be performed by the implementation of FIGS. 6B and 6C.

FIG. 7 shows a block 702 receiving a Huffman code table. From this table, a block 704 generates a corresponding compact table. With reference to FIG. 6B, this block may be implemented with compact table generator 606.

A Huffman encoded bit stream is received at a block 706. A prefix (i.e., a predetermined number of initial bits) within the bit stream is identified by a block 708. As described above, embodiments may employ four bit prefixes. However, prefixes of other length may be employed.

As shown in FIG. 7, a block 710 selects a table entry based on the identified prefix. This table entry corresponds to a top level group (Group 0).

A block 712 performs a masking operation (e.g., an exclusive OR operation) between a subsequent number of bits following the prefix and a mask in the selected table entry. This mask is the top level mask (Group 0 mask) of the The result of this masking operation is analyzed by a block 714. This analysis may comprise detecting a run length of a particular value, such as a run of 0's.

Based on the detected run length, a block 716 accesses a new address (also referred to as a jump address) in the compact table.

As shown in FIG. 7, a block 718 retrieves a mask from the new address, and performs a mask operation between one or more bits in the bit stream and a mask stored at the new address. This number of bits may be the subsequent number of bits referred to above with reference to block 712. Alternatively, the one or more bits may be from that subsequent number of bits that follow the run length determined by block 716.

A block 720 analyzes the result of this masking operation. This may involve detecting a run length of a particular value, such as a run of 0's. Based on the detected run length, a block 722 accesses a new (jump) address in the compact table.

As indicated by a block 724, it is determined whether the entry at this new address has a code index or a further mask. If the entry has a code index, then unencoded syntax corresponding to an accessed codeword has been identified. Thus, operation may return to block 708 for processing of subsequent bits in the encoded bit stream. Otherwise, further processing is required and operation returns to block 718 so processing of the mask may proceed.

Figure 8:
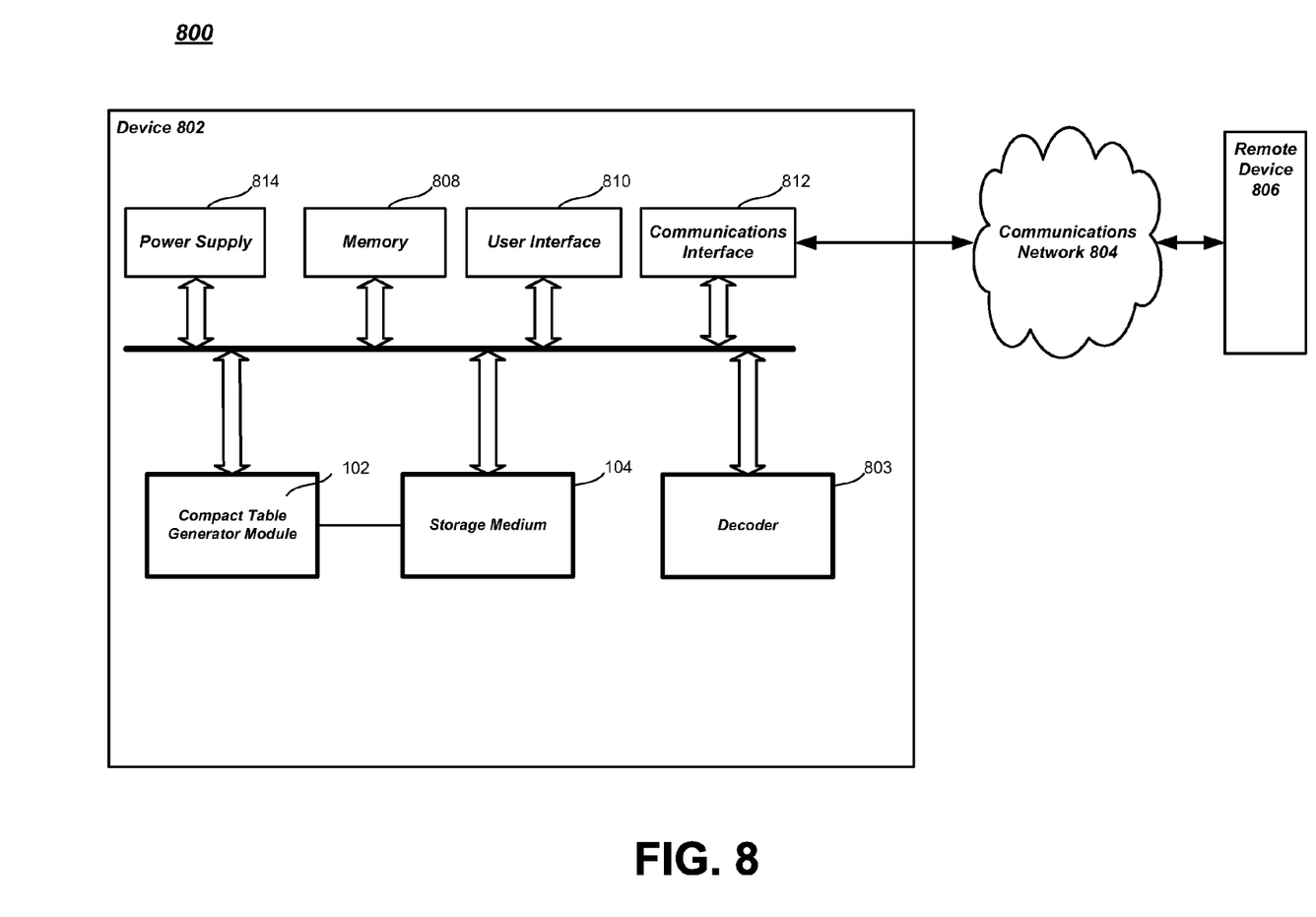
FIG. 8 is a diagram of a system embodiment.

FIG. 8 illustrates one embodiment of a system. In particular, FIG. 8 illustrates a system 800, which may be representative of a system or architecture suitable for use with one or more embodiments described herein As shown in FIG. 8, system 800 may include a device 802, a communications network 804, and one or more remote devices 806. FIG. 8 shows that device 802 may include the elements of FIG. 1. Further, FIG. 8 shows that device 802 may include a decoder 803. This decoder may perform fast compact decoding techniques, such as those described above with reference to FIG. 7. Moreover, decoder 803 may implement the features of decoder 608 and/or 608'.

In addition, device 802 may include a memory 808, a user interface 810, a communications interface 812, and a power supply 814. These elements may be coupled according to various techniques. One such technique involves employment of one or more bus interfaces.

Memory 808 may store information in the form of data. For instance, memory 808 may store information contained by storage medium 104. Thus, while shown separately, memory 808 may comprise storage medium 104.

Alternatively or additionally, memory 808 may store control logic, instructions, and/or software components. These software components include instructions that can be executed by a processor. Such instructions may provide functionality of one or more elements in system 800.

Memory 808 may be implemented using any machine-readable or computer-readable media capable of storing data, including both volatile and non-volatile memory. For example, memory 808 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information.

User interface 810 facilitates user interaction with device 802. This interaction may involve the input of information from a user. This interaction may also involve the output of information, such as content, to a user. Accordingly, user interface 810 may include one or more devices, such as a keypad, a touch screen, a microphone, and/or an audio speaker. In addition, user interface 810 may include a display to output information and/or render images/video processed by device 802. Exemplary displays include liquid crystal displays (LCDs), plasma displays, and video displays.

Communications interface 812 provides for the exchange of information with other devices across communications media, such as network. This information may include content, such as image, video, and/or audio transmissions—in either encoded or unencoded formats.

Communications interface 812 may provide for wireless or wired communications. For wireless communications, communications interface 812 may include components, such as a transceiver, an antenna, and control logic to perform operations according to one or more communications protocols. Thus, communications interface 812 may communicate across wireless networks according to various protocols. For example, device 802 and device(s) 806 may operate in accordance with various wireless local area network (WLAN) protocols, such as the IEEE 802.11 series of protocols, including the IEEE 802.11a, 802.11b, 802.11e, 802.11g, 802.11n, and so forth. In another example, these devices may operate in accordance with various wireless metropolitan area network (WMAN) mobile broadband wireless access (MBWA) protocols, such as a protocol from the IEEE 802.16 or 802.20 series of protocols. In another example, these devices may operate in accordance with various wireless personal area networks (WPAN). Such networks include, for example, IEEE 802.16e, Bluetooth, and the like. Also, these devices may operate according to Worldwide Interoperability for Microwave Access (WiMax) protocols, such as ones specified by IEEE 802.16.

Also, these devices may employ wireless cellular protocols in accordance with one or more standards. These cellular standards may comprise, for example, Code Division Multiple Access (CDMA), CDMA 2000, Wideband Code-Division Multiple Access (W-CDMA), Enhanced General Packet Radio Service (GPRS), among other standards. The embodiments, however, are not limited in this context.

For wired communications, communications interface 812 may include components, such as a transceiver and control logic to perform operations according to one or more communications protocols. Examples of such communications protocols include Ethernet (e.g., IEEE 802.3) protocols, integrated services digital network (ISDN) protocols, public switched telephone network (PSTN) protocols, and various cable protocols.

In addition, communications interface 812 may include input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Power supply 814 provides operational power to elements of device 802. Accordingly, power supply 814 may include an interface to an external power source, such as an alternating current (AC) source. Additionally or alternatively, power supply 814 may include a battery. Such a battery may be removable and/or rechargeable. However, the embodiments are not limited to this example.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
   a processor;
   a compact table generator module executing on the processor to generate a compact code table, the compact code table comprising a plurality of code word groups arranged in one or more hierarchies, each code word group having a group mask that corresponds to one or more code words in a variable length code table; and
   a storage medium to store information regarding the code word groups, the information comprising the group mask for each of the code word groups, and a code index for each code word in the variable length code table.

2. The apparatus of claim 1, wherein the compact table generator module comprises:
   a top-level group identification module to generate one or more top level groups of the plurality of code word groups;
   a group analysis module to determine a group mask for each of the top-level groups.

3. The apparatus of claim 2, wherein the group analysis module is to identify one or more subgroups from the one or more top-level groups and generate a mask for each of the subgroups.

4. The apparatus of claim 1, wherein the variable length code table is a Huffman code table.

5. The apparatus of claim 1, further comprising a decoder to decode an input bitstream with the compact code table.

6. The apparatus of claim 5, wherein the decoder is to receive one or more rearrangement rules, and is to rearrange the compact code table based on the one or more rearrangement rules.

7. A method executing on at least one of a hardware element and a processor, comprising:
   receiving a variable length code table having a plurality of code words;
   generating a compact code table, the compact code table comprising a plurality of code word groups arranged in one or more hierarchies, each code word group having a group mask;
   storing information regarding the code word groups, wherein the information includes the group mask for each of the code word groups, and a code index for each code word in the variable length code table; and
   decoding an input bitstream with the compact code table.

8. The method of claim 7, wherein the variable length code table is a Huffman code table.

9. The method of claim 7, wherein the plurality of code word groups includes one or more top-level groups and one or more sub groups, and wherein said generating the plurality of code word groups comprises:
   iteratively generating the one or more sub groups from the one or more top-level groups.

10. The method of claim 9, wherein said iteratively generating the one or more sub groups comprises
selecting one of the plurality of code word groups;
generating the group mask of the selected code word group;
producing one or more masked values with the group mask of the selected code word group and the one or more code words within the selected code word group; and
when two or more of the masked values share a run length characteristic, creating a new sub group and transferring the code words corresponding to the two or more masked values from the selected code word group to the new sub group.

11. The method of claim 10, wherein said producing one or more masked values comprises performing exclusive OR (XOR) operations between the mask of the selected code word group and each of the code words within the selected code word group.

12. The method of claim 7, further comprising:
receiving one or more rearrangement rules, and
rearranging the compact code table based on the one or more rearrangement rules.

13. An article comprising a non-transitory machine-readable storage medium containing instructions that if executed enable a system to:
receive a variable length code table having a plurality of code words;
generate a compact code table, the compact code table comprising a plurality of code word groups arranged in one or more hierarchies, each code word group having a group mask and;
store information regarding the code word groups, wherein the information includes the group mask for each of the code word groups, and a code index for each code word in the variable length code table.

14. The article of claim 13, wherein the variable length code table is a Huffman code table.

15. The article of claim 13, wherein the plurality of code word groups includes one or more top-level groups and one or more sub groups, and wherein the machine-readable storage medium contains instructions that if executed enable the system to iteratively generate the one or more sub groups from the one or more top-level groups.

16. A system, comprising:
a compact table generator module to generate a compact code table, the compact code table comprising a plurality of code word groups arranged in one or more hierarchies, each code word group having a group mask that corresponds to one or more code words in a variable length code table;
a storage medium to store information regarding the code word groups, the information comprising the group mask for each of the code word groups, and a code index for each code word in the variable length code table;
a decoder to decode an input bitstream with the compact code table; and
a communications interface to receive the input bitstream from a communications medium.

* * * * *